United States Patent
Ohno

(10) Patent No.: US 11,921,600 B2
(45) Date of Patent: Mar. 5, 2024

(54) MEMORY SYSTEM

(71) Applicant: KIOXIA CORPORATION, Tokyo (JP)

(72) Inventor: Katsuya Ohno, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 367 days.

(21) Appl. No.: 17/177,076

(22) Filed: Feb. 16, 2021

(65) Prior Publication Data
US 2021/0342242 A1    Nov. 4, 2021

(30) Foreign Application Priority Data
May 1, 2020  (JP) .............................. 2020-080973

(51) Int. Cl.
| | |
|---|---|
| G11C 7/04 | (2006.01) |
| G06F 3/06 | (2006.01) |
| G06F 11/30 | (2006.01) |
| G11C 11/406 | (2006.01) |

(52) U.S. Cl.
CPC ........ *G06F 11/3037* (2013.01); *G06F 3/0614* (2013.01); *G06F 3/0653* (2013.01); *G06F 3/0688* (2013.01); *G06F 11/3058* (2013.01); *G06F 11/3075* (2013.01); *G11C 7/04* (2013.01); *G11C 11/40626* (2013.01)

(58) Field of Classification Search
CPC .. G06F 11/3037; G06F 3/0614; G06F 3/0653; G06F 3/0688
USPC .......................................................... 365/211
See application file for complete search history.

(56) References Cited

U.S. PATENT DOCUMENTS

| | | | |
|---|---|---|---|
| 2016/0320971 A1* | 11/2016 | Postavilsky | G06F 3/0659 |
| 2018/0067690 A1 | 3/2018 | Jayaraman et al. | |
| 2018/0358080 A1* | 12/2018 | Huang | G11C 7/04 |
| 2019/0012098 A1 | 1/2019 | Hashimoto | |
| 2019/0179547 A1* | 6/2019 | Szubbocsev | G06F 13/4234 |
| 2020/0050246 A1* | 2/2020 | Karalnik | H05K 1/0203 |

FOREIGN PATENT DOCUMENTS

JP    2017211808 A    11/2017

* cited by examiner

*Primary Examiner* — Vu A Le
(74) *Attorney, Agent, or Firm* — Kim & Stewart LLP

(57) ABSTRACT

A memory system includes a nonvolatile semiconductor memory, a controller that controls the nonvolatile semiconductor memory, and a temperature sensor that acquires an operating temperature of at least one of the nonvolatile semiconductor memory and the controller. The controller calculates a temperature parameter based on operating temperatures acquired by the temperature sensor over a period of time, and switches between a plurality of operation settings in which electric power consumptions of the memory system vary, based on the temperature parameter.

18 Claims, 5 Drawing Sheets

MEMORY SYSTEM

CROSS-REFERENCE TO RELATED APPLICATION

This application is based upon and claims the benefit of priority from Japanese Patent Application No. 2020-080973, filed on May 1, 2020, the entire contents of which are incorporated herein by reference.

FIELD

Embodiments described herein relate generally to a memory system including a nonvolatile semiconductor memory.

BACKGROUND

A solid state drive (SSD) or the like is used as a memory system that includes a nonvolatile semiconductor memory. Various studies have been conducted on the control of the nonvolatile semiconductor memory with the goal of reducing the number of failures of the memory system.

DETAILED DESCRIPTION

Figure 1:
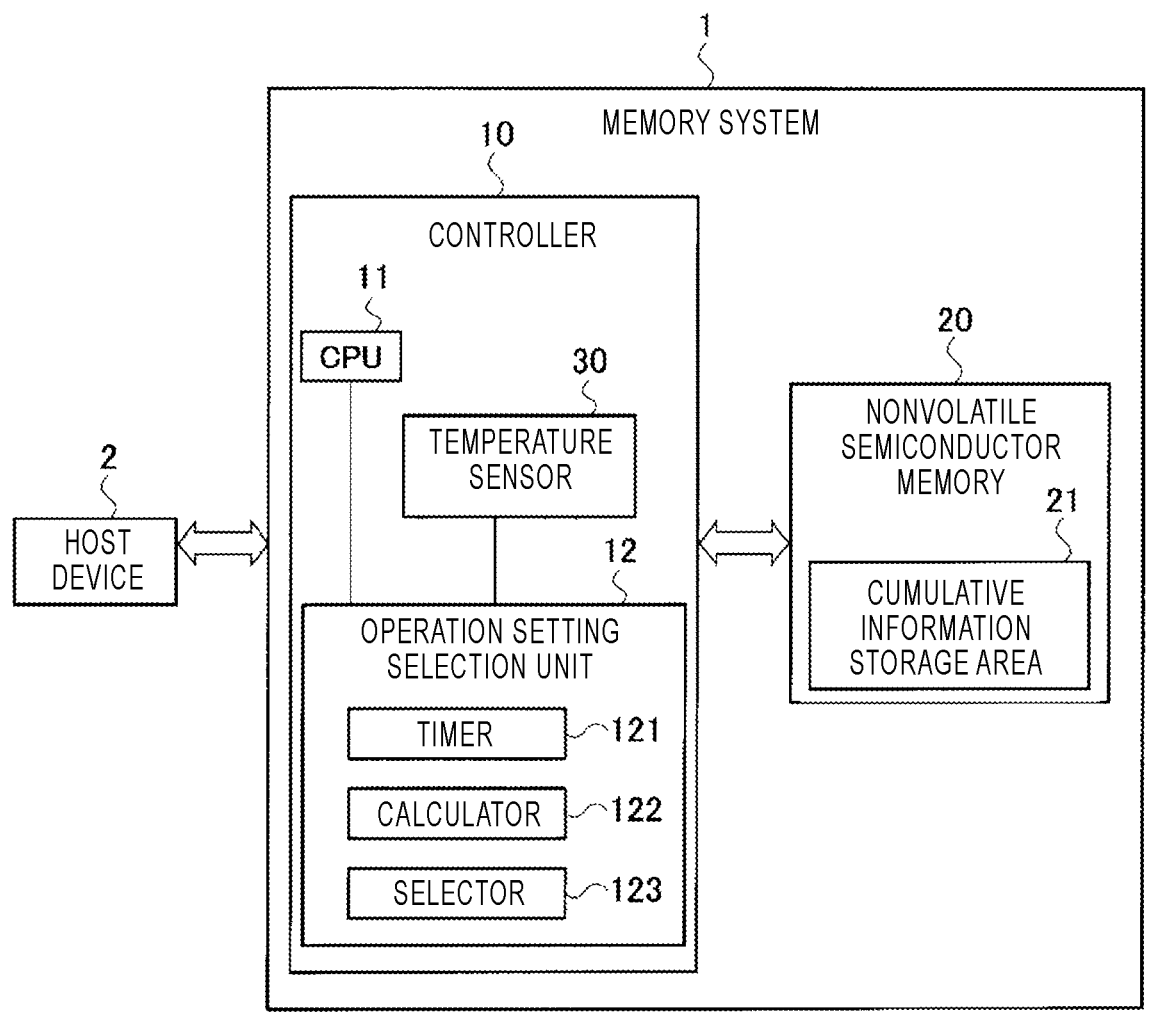
FIG. 1 is a block diagram illustrating the configuration of a memory system according to a first embodiment.

Embodiments provide a memory system that includes a nonvolatile semiconductor memory, in which a failure occurrence rate is reduced.

In general, according to one embodiment, a memory system includes a nonvolatile semiconductor memory, a controller that controls the nonvolatile semiconductor memory, and a temperature sensor that acquires an operating temperature of at least one of the nonvolatile semiconductor memory and the controller. The controller calculates a temperature parameter based on operating temperatures acquired by the temperature sensor over a period of time, and switches between a plurality of operation settings in which electric power consumptions of the memory system vary, based on the temperature parameter.

Hereinafter, embodiments will be described with reference to the accompanying drawings. In the description of the drawings, same parts will be denoted by same reference numerals, and descriptions thereof will not be repeated.

First Embodiment

A memory system 1 according to the first embodiment of the present disclosure is, for example, an SSD. The memory system 1 may be connected to a host device 2.

As illustrated in FIG. 1, the memory system 1 includes a nonvolatile semiconductor memory 20, a controller 10 that controls the nonvolatile semiconductor memory 20, and a temperature sensor 30. The nonvolatile semiconductor memory is, for example, a NAND type flash memory. The temperature sensor 30 acquires the operating temperature of at least one of the nonvolatile semiconductor memory 20 and the controller 10 at predefined time intervals (the predefined time interval hereinafter is referred to as the sampling interval).

The host device 2 may be an information processing apparatus such as a personal computer or a server. The host device 2 may also be an image capturing device such as a digital camera. The host device 2 may also be a mobile terminal such as a tablet computer, a mobile phone, or a smart phone. The host device 2 may also be a game device. The host device 2 may also be an in-vehicle terminal such as a car navigation system. The host device 2 may also be a processor mounted in an information processing apparatus, an image capturing device, a mobile terminal, a game device, an in-vehicle terminal, etc.

The controller 10 may be implemented by a circuit such as a system-on-a-chip (SoC). The controller 10 includes a central processing unit (CPU) 11, an operation setting selection unit 12, and the temperature sensor 30.

The CPU 11 controls the operation of the memory system 1. The configuration of the operation setting selection unit 12 will be described later. Each function of the controller 10 may be implemented as firmware executed by the CPU 11. Each function of the controller 10 may also be implemented by dedicated hardware in the controller 10.

The controller 10 controls a communication between the host device 2 and the memory system 1. Specifically, the controller 10 receives commands from the host device 2, and controls the nonvolatile semiconductor memory 20 to execute a write operation or a read operation. For example, the controller 10 controls the nonvolatile semiconductor memory 20 to write data specified by a write command (hereinafter, referred to as "write data"). Further, the controller 10 transmits data that is specified by a read command and read from an address of the nonvolatile semiconductor memory 20, to the host device 2. Alternatively, the controller 10 controls the nonvolatile semiconductor memory 20 to execute an erase operation to erase stored data. Hereinafter, a write operation, a read operation, and an erase operation executed by the nonvolatile semiconductor memory 20 will be also collectively referred to as "operation of the nonvolatile semiconductor memory 20."

The operating temperature acquired by the temperature sensor 30 is, for example, a temperature of a pn junction of a semiconductor device that makes up the controller 10 or the nonvolatile semiconductor memory 20. The temperature sensor 30 is, for example, a thermocouple. Alternatively, the temperature sensor 30 may be a semiconductor temperature sensor. The semiconductor temperature sensor measures a temperature by using an electrical characteristic that changes in proportion to a temperature change in the band gap of the semiconductor.

The temperature sensor 30 disposed in the controller 10 acquires the operating temperature of the controller 10. When the operating temperature of the controller 10 acquired by the temperature sensor 30 differs from an actual operating temperature of the nonvolatile semiconductor memory 20, the difference is determined in advance through, for example, actual measurement. The controller 10 corrects the operating temperature acquired by the temperature sensor according to the difference, thereby calculating the operating temperature of the nonvolatile semiconductor memory 20. In this manner, in the memory system 1, the operating temperature of either the controller 10 or the nonvolatile semiconductor memory 20 is acquired. Hereinafter, unless otherwise specified, the term "operating temperature" refers to the operating temperature of the controller 10 or the operating temperature of the nonvolatile semiconductor memory 20.

The controller 10 calculates a specific temperature parameter by using information of the operation period of the memory system 1 and information of the operating temperature acquired by the temperature sensor 30. The operation period of the memory system 1 is, for example, a period during which the memory system 1 is operating, that is, from the start of the memory system 1 to the stop of the memory system 1. The operation period of the memory system 1 is, for example, a period during which the memory system 1 is consuming electric power, that is, until the supply of electric power to the memory system 1 is interrupted after the supply of electric power to the memory system 1 starts. A period obtained by accumulating (i.e., summing up) all past operation periods of the memory system 1 is referred to as a "cumulative operation period" of the memory system 1.

The temperature parameter includes a temperature obtained by accumulating the operating temperatures acquired by the temperature sensor 30 at predefined time intervals in the past operation periods of the memory system 1 (hereinafter, also referred to as a "cumulative operating temperature"). The temperature parameter may also be an average operating temperature in the past operation periods of the memory system 1 (hereinafter, also referred to as an "average operating temperature"). The average operating temperature is obtained by dividing the cumulative operating temperature by the total number of temperature measurements taken, which is equal to the cumulative operation period divided by the sampling interval of the temperature sensor 30. Alternatively, the cumulative operating temperature is obtained as a product of the average operating temperature and the cumulative operation period divided by the sampling interval of the temperature sensor 30. The cumulative operating temperature is obtained by accumulating operating temperatures regardless of whether or not they satisfy a specific condition. For example, the cumulative operating temperature is obtained by accumulating operating temperatures regardless of whether or not they exceed a specific temperature. Accordingly, the controller 10 calculates the cumulative operating temperature by accumulating the operating temperatures acquired by the temperature sensor 30 during the operation periods, regardless of the range of the operating temperatures.

The controller 10 dynamically switches between a plurality of operation settings in which electric power consumptions of the memory system 1 vary, according to the temperature parameter, and controls the nonvolatile semiconductor memory 20 to operate according to the operation settings. Here, the "operation setting" is a setting that defines the operation of the nonvolatile semiconductor memory 20.

Hereinafter, descriptions will be made for a case where there are two types of operation settings, that is, a first operation setting, and a second operation setting in which the electric power consumption of the memory system 1 is smaller than that in the first operation setting. An operation setting in which the data transfer efficiency is prioritized over the electric power consumption may be set as the first operation setting, and an operation setting in which the reduction of the electric power consumption is prioritized over the data transfer efficiency may be set as the second operation setting. Hereinafter, an operation of reducing the electric power consumption of the memory system 1 will be also referred to as an "electric power throttling operation." Details of the electric power throttling operation will be described later.

The controller 10 controls the nonvolatile semiconductor memory 20 to operate according to the first operation setting during a period when the temperature parameter satisfies a predetermined operating temperature condition. The controller 10 controls the nonvolatile semiconductor memory 20 to operate according to the second operation setting during a period when the temperature parameter does not satisfy the operating temperature condition.

The operating temperature condition for the temperature parameter is set according to the operating temperature or the like that affects the failure occurrence rate of the memory system 1. For example, during a period in which the temperature parameter does not satisfy the operating temperature condition, the failure occurrence rate of the memory system 1, which is caused by the operating temperature, may increase. In such a situation, the controller 10 may set a threshold temperature as the operating temperature condition. For example, during a period in which the temperature parameter exceeds the threshold temperature, there is a concern that electromigration may occur in the controller 10 or the nonvolatile semiconductor memory 20.

The controller 10 may control the nonvolatile semiconductor memory 20 to operate according to the first operation setting during a period in which the temperature parameter does not exceed the threshold temperature. Meanwhile, during a period in which the temperature parameter is equal to or higher than the threshold temperature, the controller 10 may control the nonvolatile semiconductor memory 20 to operate according to the second operation setting. Through such switching of the operation settings by the controller 10, an increase of the operating temperature is prevented in the memory system 1.

The operation setting selection unit 12 switches the operation setting of the nonvolatile semiconductor memory 20 according to the temperature parameter. The temperature sensor 30 transmits the acquired operating temperature to the operation setting selection unit 12.

The operation setting selection unit 12 is, for example, a circuit that includes the following sections: a timer 121, a calculator 122, and a selector 123. The timer 121 measures the operation period of the memory system 1. The calculator 122 calculates the temperature parameter by using, for example, information of the cumulative operation period of the memory system 1 and information of the cumulative operating temperature. The selector 123 selects the operation setting of the nonvolatile semiconductor memory 20 based on the temperature parameter.

The operation setting selection unit 12 transmits the operation setting selected by the selector 123, to the CPU 11. The CPU 11 controls the operation of the nonvolatile semiconductor memory 20 according to the selected operation setting.

Hereinafter, information of the cumulative operating temperature (cumulative operating temperature information) and information of the cumulative operation period (cumulative operation period information) will be also referred to as "cumulative information." The nonvolatile semiconductor memory 20 includes a cumulative information storage area 21 that stores the cumulative information. The controller 10 calculates the temperature parameter by using the cumulative information read from the cumulative information storage area 21.

Figure 2:
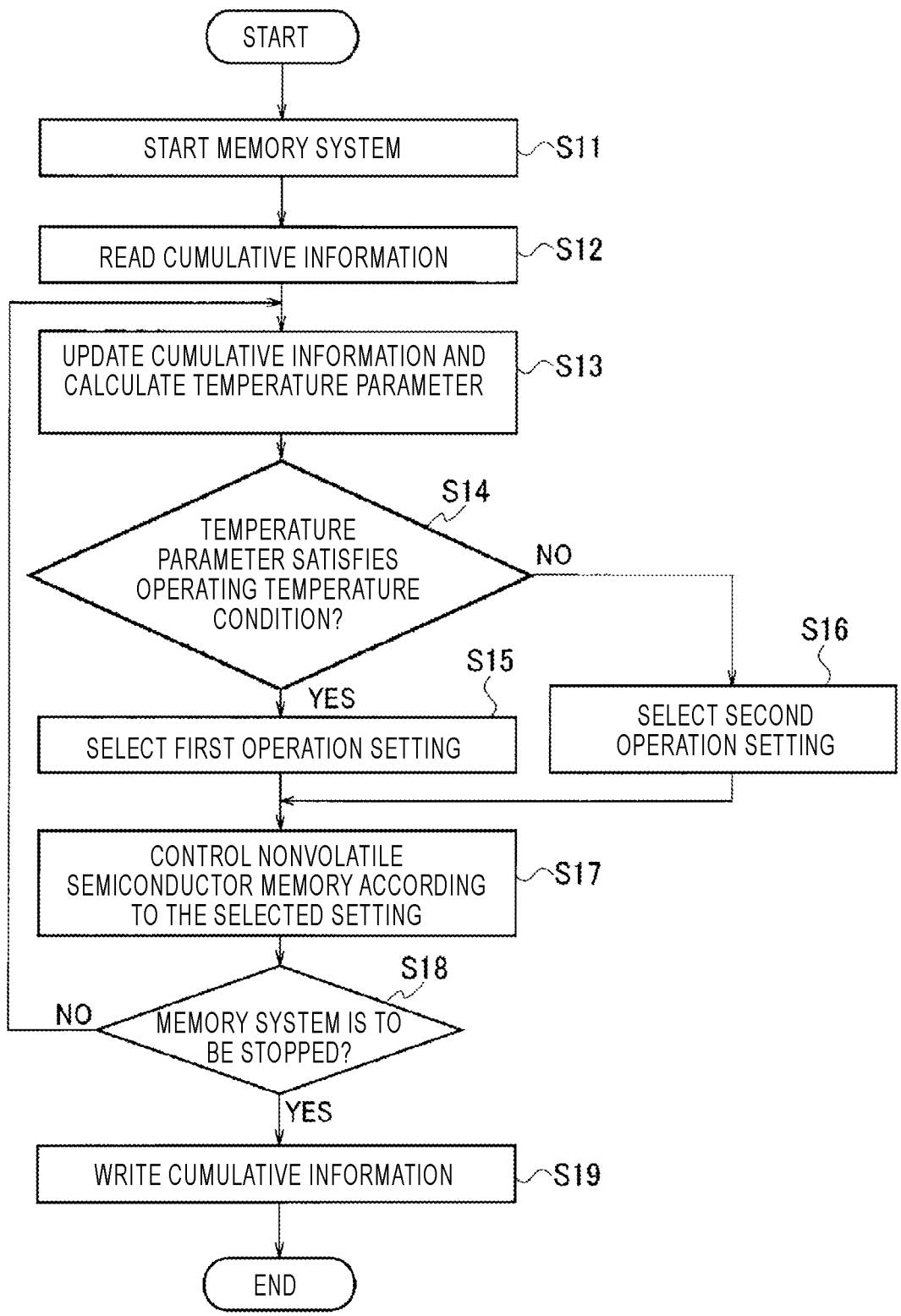
FIG. 2 is a flowchart illustrating the operation of the memory system according to the first embodiment.

Descriptions will be made for the operation of the memory system 1 with reference to the flowchart illustrated in FIG. 2. Hereinafter, descriptions will be made for a case where the temperature parameter is the average operating temperature.

In step S11, the memory system 1 starts. In step S12, the controller 10 reads the cumulative information from the cumulative information storage area 21.

In step S13, the controller 10 updates the cumulative information, and simultaneously, calculates the temperature parameter. Specifically, the controller 10 adds an operation period of the memory system 1 after the cumulative operation period information was updated at the previous time, which is measured by the timer 121, to the cumulative operation period information in the cumulative information, so as to update the cumulative operation period information. The controller 10 calculates the average operating temperature by using an operating temperature acquired by the temperature sensor 30. For example, the calculator 122 adds the operating temperature of the memory system 1 to the cumulative operating temperature information after the cumulative operating temperature information was updated at the previous time. Then, the controller 10 calculates the average operating temperature by dividing the updated cumulative operating temperature by the updated total number of temperature measurements taken, which is equal to the updated cumulative operation period divided by the sampling interval of the temperature sensor 30.

In step S14, the controller 10 determines whether the temperature parameter (here, the average operating temperature) satisfies the predetermined operating temperature condition. When it is determined that the temperature parameter satisfies the operating temperature condition (YES in step S14), the selector 123 selects the first operation setting in step S15. Meanwhile, when it is determined that the temperature parameter does not satisfy the operating temperature condition (NO in step S14), the selector 123 selects the second operation setting in step S16. For example, the selector 123 selects the first operation setting when the average operating temperature does not exceed the threshold temperature, and selects the second operation setting when the average operating temperature is equal to or higher than the threshold temperature.

In step S17, the controller 10 controls the nonvolatile semiconductor memory 20 to operate according to the first operation setting or the second operation setting, depending on the operation setting selected by the selector 123. Then, in step S18, the controller 10 detects whether the memory system 1 is to be stopped. For example, the host device 2 may notify the memory system 1 that the electric power supplied to the memory system 1 is to be cut off. While the controller 10 does not detect that the memory system 1 is to be stopped, the memory system 1 repeats the operation from steps S13 to S17. When the controller 10 detects that the memory system 1 is to be stopped, the operation proceeds to step S19.

In step S19, the controller 10 writes the cumulative information including the updated cumulative operation period information and the cumulative operating temperature information, in the cumulative information storage area 21. Then, the memory system 1 is stopped. The cumulative information written in the cumulative information storage area 21 is read out by the controller 10 when the memory system 1 starts at the next time.

When the memory system 1 starts for the first time, step S12 is omitted.

The timing at which the controller 10 writes the cumulative information in the cumulative information storage area 21 is not limited to the timing immediately before the memory system 1 is stopped. For example, the controller 10 may write the cumulative information in the cumulative information storage area 21 at regular time intervals during the operation period of the memory system 1. Alternatively, the controller 10 may write the cumulative information in the cumulative information storage area 21, for example, in response to a command from the host device 2.

Figure 3:
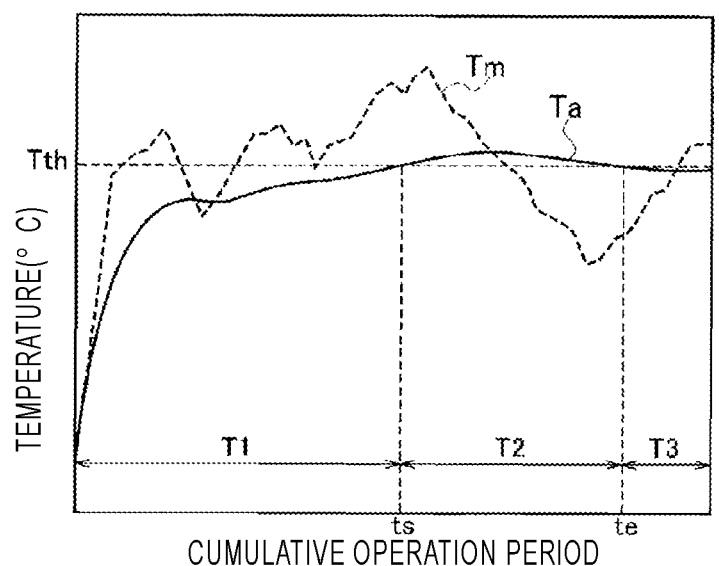
FIG. 3 is a graph illustrating the operation of the memory system according to the first embodiment.

The graph of FIG. 3 illustrates an example of the relationship among the cumulative operation period, the operating temperature, and the average operating temperature of the memory system 1. The horizontal axis in the graph represents the cumulative operation period of the memory system 1. The vertical axis in the graph represents a temperature. The operating temperature Tm is indicated by a broken line. The average operating temperature Ta is indicated by a solid line. Here, the temperature parameter is the average operating temperature. The operating temperature condition is a threshold temperature Tth. The starting point of the cumulative operation period is the timing at which the memory system 1 starts for the first time.

In FIG. 3, during a first period T1 and a third period T3 in which the average operating temperature Ta does not exceed the threshold temperature Tth, the controller 10 controls the nonvolatile semiconductor memory 20 to operate according to the first operation setting. Then, during a second period T2 in which the average operating temperature Ta is equal to or higher than the threshold temperature Tth, the controller 10 controls the nonvolatile semiconductor memory 20 to operate according to the second operation setting. For example, from a first timing is at which the average operating temperature Ta reaches the threshold temperature Tth, the controller 10 starts the electric power throttling operation of the memory system 1. Then, at a second timing to at which the average operating temperature Ta becomes lower than the threshold temperature Tth, the controller 10 ends the electric power throttling operation.

Hereinafter, descriptions will be made for an example of the electric power throttling operation of the memory system 1, which achieves the reduction of electric power consumption, and furthermore, the reduction of the operating temperature, in the second operation setting.

When write data is compressed, the amount of data to be written in the nonvolatile semiconductor memory 20 is reduced, and thus, the electric power consumption for the write operation is reduced. Thus, in one embodiment, write data is not compressed in the first operation setting, whereas write data is compressed in the second operation setting. When the nonvolatile semiconductor memory 20 is a NAND type flash memory, a single-level cell (SLC) method for storing 1-bit information per memory cell, and a triple-level cell (TLC) method for storing 3-bit information per cell may be adopted for the write operation. The TLC method stores a larger number of bits per memory cell than that in the SLC method. In another embodiment, the TLC method is adopted in the first operation setting, and the SLC method is adopted in the second operation setting. When the write operation is switched from the TLC method to the SLC method, the electric power consumption of the memory system 1 is reduced. Instead of the TLC method, a multi-level cell (MLC) method for storing 2-bit information per cell may be adopted, so that the switching is conducted between the MLC method and the SLC method. Instead of the TLC method, a quad-level cell (QLC) method for storing 4-bit information per cell may be adopted, so that the switching is conducted between the QLC method and the SLC method.

In the second operation setting, as the electric power throttling operation, a control may be performed to prevent a compaction operation and a refresh operation, and prioritize an access to the nonvolatile semiconductor memory 20 in response to a command from the host device 2. In the second operation setting that prevents the compaction operation and the refresh operation, the electric power consumption of the memory system 1 is reduced, as compared to that in the first operation setting that does not prevent the compaction operation and the refresh operation. In the second operation setting, either the compaction operation or the refresh operation may be prevented.

As the electric power throttling operation, a control may be performed to insert a wait time for access to the nonvolatile semiconductor memory 20. By this control, the write operation, the read operation, and the erase operation are placed on standby during the wait time. In the second operation setting, when the wait time for the access to the nonvolatile semiconductor memory 20 is inserted, the interval between accesses to the nonvolatile semiconductor memory 20 becomes longer, and then, the electric power consumption of the memory system 1 per unit time is reduced. The wait time to be inserted for the operation of the nonvolatile semiconductor memory 20 is appropriately set according to the usage mode of the memory system 1. The wait times to be inserted for the write operation, the read operation, and the erase operation may be the same or different from each other.

When the nonvolatile semiconductor memory 20 includes a plurality of memory chips, as the electric power throttling operation, a control may be performed to reduce the number of memory chips accessed simultaneously. This control includes reducing the number of channels driven in parallel, or reducing the number of memory chips operating in parallel (bank interleaving) in one channel. When the number of memory chips accessed simultaneously is reduced, the electric power consumption of the memory system 1 is reduced.

The method of reducing the electric power consumption of the memory system 1 is not limited to the above-described examples of the electric power throttling operation, and may employ other techniques known in the art.

As described above, the controller 10 switches the operation setting of the memory system 1 according to the temperature parameter. For example, the controller 10 dynamically switches between the first operation setting, and the second operation setting in which the electric power consumption is smaller than that in the first operation setting, thereby reducing the electric power consumption of the memory system 1.

Therefore, according to the memory system 1, the amount of increase in the average operating temperature or the cumulative operating temperature may be reduced. As a result, the failure occurrence rate of the memory system 1 may be reduced. According to the memory system 1, for example, the occurrence of a failure caused by electromigration may be reduced.

The controller 10 may switch the operation setting of the memory system 1 immediately when the temperature parameter does not satisfy the operating temperature condition. The controller 10 may periodically check (e.g., once a week) the temperature parameter, and may switch the operation setting of the memory system 1 when the temperature parameter does not satisfy the operating temperature condition.

While descriptions have been made on a case where the nonvolatile semiconductor memory 20 is a NAND type flash memory, the nonvolatile semiconductor memory 20 may be another type of nonvolatile semiconductor memory.

In the memory system 1, the temperature sensor 30 acquires the operating temperature of each of the controller 10 and the nonvolatile semiconductor memory 20. During a period when at least one of the temperature parameter of the controller 10 and the temperature parameter of the nonvolatile semiconductor memory 20 does not satisfy the operating temperature condition, the controller 10 may control the nonvolatile semiconductor memory 20 to operate according to the second operation setting. Here, the operating temperature condition for the temperature parameter of the controller 10, and the operating temperature condition for the temperature parameter of the nonvolatile semiconductor memory 20 may be the same or different from each other. Alternatively, the operating temperature condition may be set for only one of the temperature parameter of the nonvolatile semiconductor memory 20 and the temperature parameter of the controller 10.

Modification

Figure 4:
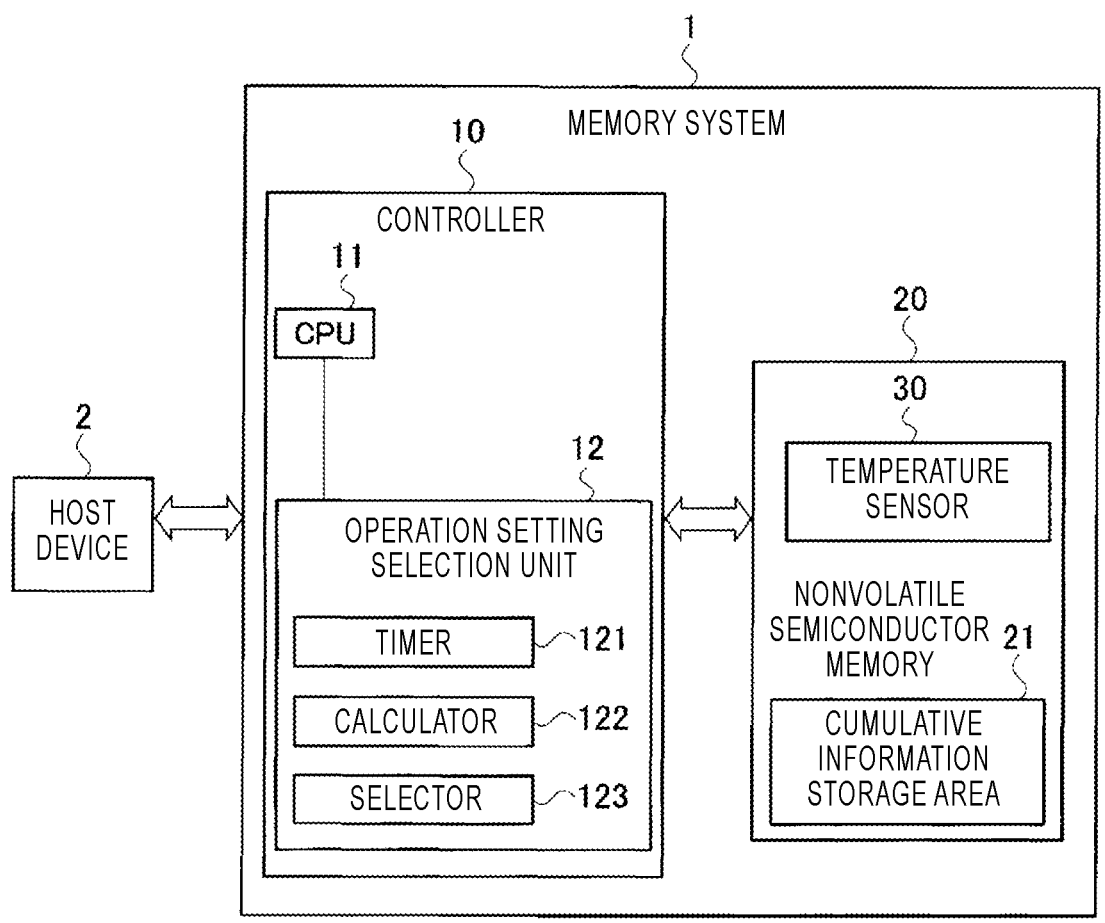
FIG. 4 is a block diagram illustrating the configuration of a memory system according to a modification of the first embodiment.

As illustrated in FIG. 4, in the memory system 1 according to a modification of the first embodiment, the temperature sensor 30 is disposed in the nonvolatile semiconductor memory 20. The temperature sensor 30 disposed in the nonvolatile semiconductor memory 20 acquires an operating temperature of the nonvolatile semiconductor memory 20. Based on a difference between the operating temperature acquired by the temperature sensor 30 and an actual operating temperature of the controller 10, it is possible to correct the operating temperature acquired by the temperature sensor 30, thereby calculating the operating temperature of the controller 10. Therefore, the memory system 1 illustrated in FIG. 4 can acquire the operating temperature of either the controller 10 or the nonvolatile semiconductor memory 20.

The temperature sensor 30 may be disposed in both the controller 10 and the nonvolatile semiconductor memory 20. In such a case, the controller 10 may acquire the operating temperature of any of the controller 10 and the nonvolatile semiconductor memory 20 without correcting the operating temperature acquired by the temperature sensor 30.

Alternatively, in the memory system 1 having a configuration where the controller 10 and the nonvolatile semiconductor memory 20 are mounted on the same printed circuit board, the temperature sensor 30 may be disposed on the printed circuit board.

Second Embodiment

Figure 5:
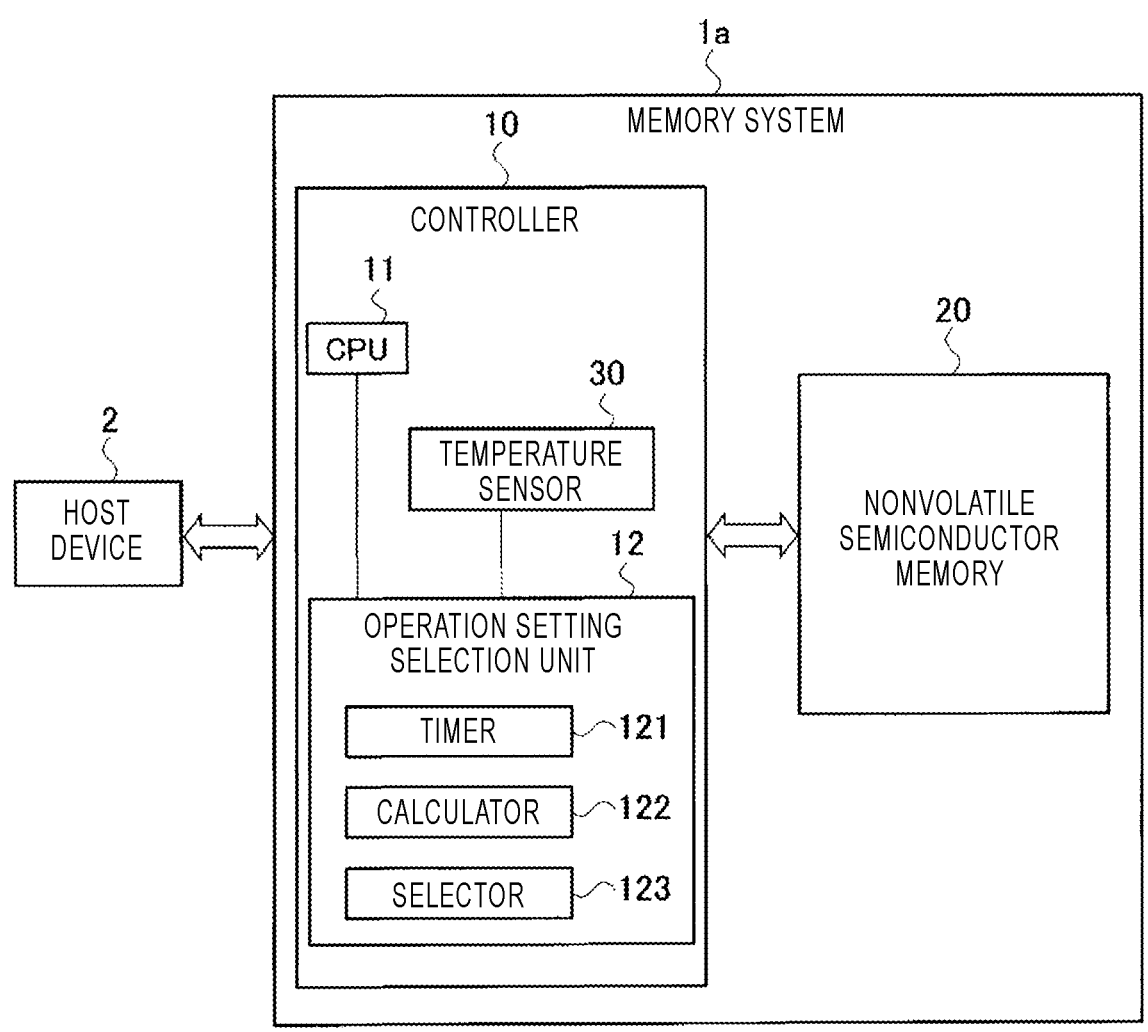
FIG. 5 is a block diagram illustrating the configuration of a memory system according to a second embodiment.

As illustrated in FIG. 5, in a memory system 1a according to a second embodiment, each time the memory system 1a starts, the controller 10 calculates the temperature parameter for each start by using the operation period information and the operating temperature information after the start. That is, the memory system 1a is different from the memory system 1 of the first embodiment in that the temperature parameter is calculated by using the operating temperature information acquired in the current operation period since the memory system 1a newly starts without referring to the cumulative information of the past operation period. Thus, the nonvolatile semiconductor memory 20 of the memory system 1*a* does not include the cumulative information storage area 21. The other configurations in the memory system 1*a* are the same as those in the memory system 1 of the first embodiment.

For example, the memory system 1*a* calculates the temperature parameter during each operation period of the memory system 1*a* so as to control the start and the end of the electric power throttling operation of the memory system 1*a*. Accordingly, in the memory system 1*a*, it is possible to reduce an increase of the average operating temperature or the cumulative operating temperature. In the second embodiment, the starting point of the cumulative operation period on the graph illustrated in FIG. 3 is a time point at which the memory system 1*a* newly starts.

Descriptions will be made for the operation of the memory system 1*a* with reference to the flowchart illustrated in FIG. 6. Hereinafter, descriptions will be made for a case where the temperature parameter is the average operating temperature.

Figure 6:
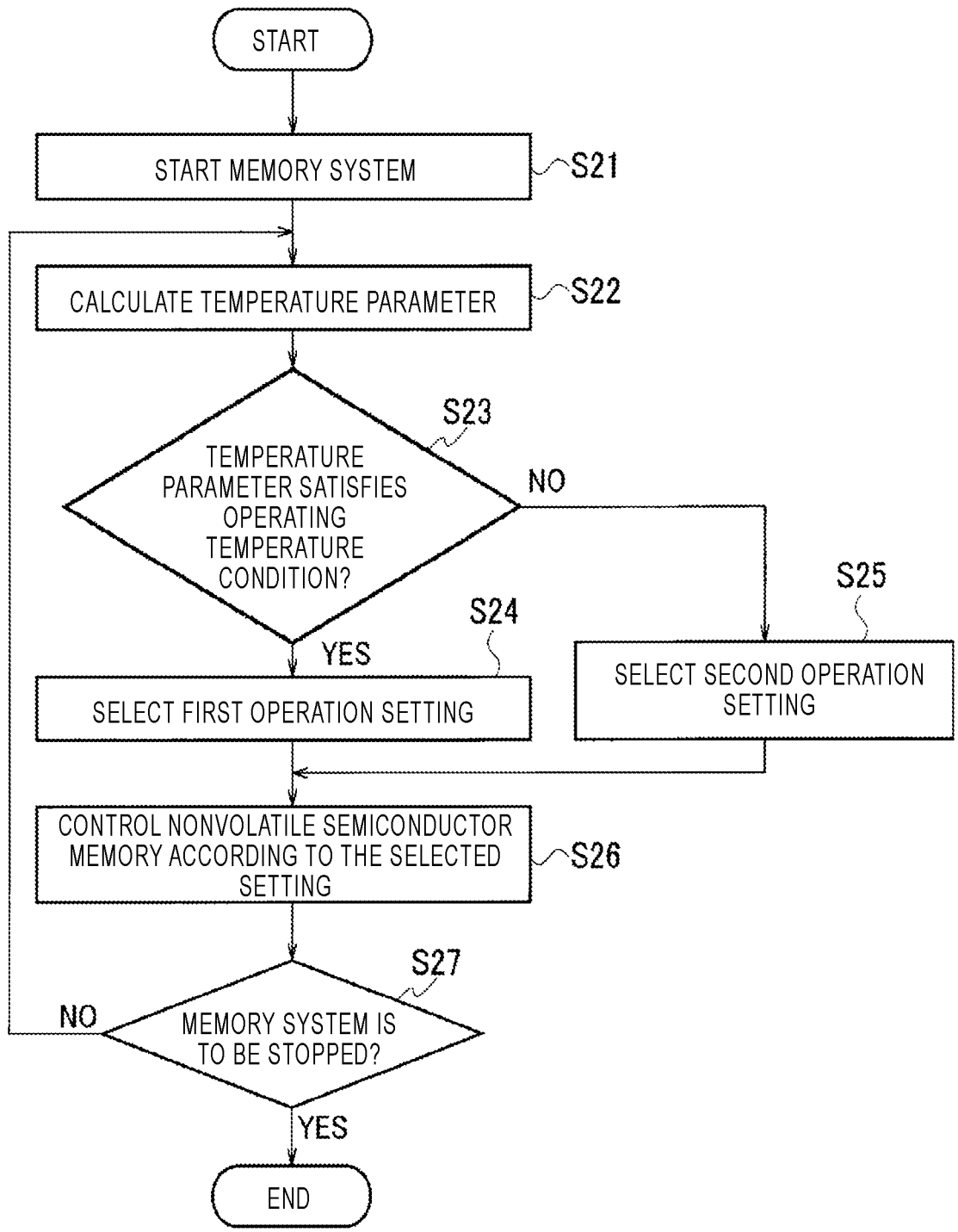
FIG. 6 is a flowchart illustrating the operation of the memory system according to the second embodiment.

In step S21 of FIG. 6, the memory system 1*a* starts. In step S22, the controller 10 calculates the temperature parameter after the memory system 1*a* starts. That is, the calculator 122 calculates the average operating temperature of the current operation period since the memory system 1*a* starts, which is measured by the timer 121, and the operating temperature acquired by the temperature sensor 30.

In step S23, the controller 10 determines whether the temperature parameter satisfies the predetermined operating temperature condition. When it is determined that the temperature parameter satisfies the operating temperature condition (YES in step S23), the selector 123 selects the first operation setting in step S24. Meanwhile, when it is determined that the temperature parameter does not satisfy the operating temperature condition (NO in step S23), the selector 123 selects the second operation setting in step S25. For example, the selector 123 selects the first operation setting when the average operating temperature does not exceed the threshold temperature, and selects the second operation setting when the average operating temperature is equal to or higher than the threshold temperature.

In step S26, the controller 10 controls the nonvolatile semiconductor memory 20 to operate according to the first operation setting or the second operation setting, depending on the operation setting selected by the selector 123. Then, in step S27, the controller 10 detects whether the memory system 1*a* is to be stopped. While the controller 10 does not detect that the memory system 1*a* is to be stopped, the memory system 1*a* repeats the operation from steps S22 to S26. When the controller 10 detects that the memory system 1*a* is to be stopped, the process ends, and the memory system 1*a* is stopped.

In the memory system 1*a* of the second embodiment, no time is required to read the cumulative information from the cumulative information storage area 21 or to write the cumulative information in the cumulative information storage area 21. Therefore, in the memory system 1*a*, an operation time can be shortened, as compared to that in the memory system 1 of the first embodiment. In view of the other configurations, the second embodiment is substantially the same as the first embodiment, and overlapping descriptions thereof will be omitted.

In the memory system 1 of the first embodiment, the cumulative information storage area 21 that stores the cumulative information is included in the nonvolatile semiconductor memory 20. However, the storage area that stores the cumulative information may be set anywhere other than the nonvolatile semiconductor memory 20. For example, a nonvolatile memory may be disposed in the controller 10, and the cumulative information may be stored in the nonvolatile memory.

Besides the above-described control of the electric power throttling operation according to the average operating temperature, a control of the electric power throttling operation may be performed according to an upper limit temperature at which the controller 10 or the nonvolatile semiconductor memory 20 is operable.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
  a nonvolatile semiconductor memory;
  a controller configured to control the nonvolatile semiconductor memory; and
  a temperature sensor for acquiring an operating temperature of at least one of the nonvolatile semiconductor memory or the controller,
  wherein the controller is configured to calculate an average operating temperature of operating temperatures acquired by the temperature sensor over a period of time, and to switch between a plurality of operation settings in which electric power consumptions of the memory system vary, based on the average temperature.

2. The memory system according to claim 1, wherein the controller is configured to:
  control the nonvolatile semiconductor memory to operate according to a first operation setting during a first period in which the average temperature parameter satisfies a predetermined operating temperature condition, and
  control the nonvolatile semiconductor memory to operate according to a second operation setting during a second period in which the average temperature parameter does not satisfy the operating temperature condition, wherein
  an electric power consumption of the memory system in the second operation setting is smaller than the electric power consumption of the memory system in the first operation setting.

3. The memory system according to claim 2, wherein the controller is configured to:
  control the nonvolatile semiconductor memory to operate according to the first operation setting during the first period in which the average operating temperature does not exceed a threshold temperature, and
  control the nonvolatile semiconductor memory to operate according to the second operation setting during the second period in which the average operating temperature is equal to or higher than the threshold temperature.

4. The memory system according to claim 3, wherein the nonvolatile semiconductor memory includes a cumulative information storage area configured to store (A) a cumulative operating temperature, which is a running total of the operating temperatures acquired by the temperature sensor and accumulated regardless of whether or not the operating temperatures satisfy a specific temperature, and (B) a cumulative operation period, which is a running total of operation periods over which the operating temperatures were acquired by the temperature sensor, and the controller is configured to calculate the average operating temperature based on the cumulative operating temperature and the cumulative operation period read from the cumulative information storage area.

5. The memory system according to claim 4, wherein
the temperature sensor is configured to acquire the operating temperatures at predefined time intervals, and
the controller is configured to calculate the average operating temperature by dividing the cumulative operating temperature by the number of temperature measurements taken by the temperature sensor, which is equal to the cumulative operation period divided by a length of one of the predefined time intervals.

6. The memory system according to claim 1, wherein the nonvolatile semiconductor memory is a NAND type flash memory.

7. The memory system according to claim 1, wherein the temperature sensor is configured to acquire the operating temperature of the nonvolatile semiconductor memory.

8. The memory system according to claim 1, wherein the temperature sensor is configured to acquire the operating temperature of the controller.

9. A memory system comprising:
a nonvolatile semiconductor memory;
a controller configured to control the nonvolatile semiconductor memory; and
a temperature sensor for acquiring an operating temperature of at least one of the nonvolatile semiconductor memory or the controller,
wherein the controller is configured to:
calculate a temperature parameter based on operating temperatures acquired by the temperature sensor over a period of time that starts after a power-on of the memory system, and
switch between a plurality of operation settings in which electric power consumptions of the memory system vary, based on the temperature parameter,
wherein the temperature parameter is an average operating temperature of the operating temperatures acquired by the temperature sensor over the period of time regardless of whether or not the operating temperatures satisfy a specific temperature, and the controller is further configured to:
control the nonvolatile semiconductor memory to operate according to a first operation setting during a first period in which the average operating temperature does not exceed a threshold temperature, and
control the nonvolatile semiconductor memory to operate according to a second operation setting during a second period in which the average operating temperature is equal to or higher than the threshold temperature, and
wherein an electric power consumption of the memory system in the second operation setting is smaller than the electric power consumption of the memory system in the first operation setting.

10. The memory system according to claim 9, wherein
the temperature sensor is configured to acquire the operating temperatures at predefined time intervals, and
the controller is configured to calculate the average operating temperature by dividing a cumulative operating temperature by the number of temperature measurements taken by the temperature sensor, which is equal to a cumulative operation period divided by a length of one of the predefined time intervals.

11. The memory system according to claim 9, wherein the nonvolatile semiconductor memory is a NAND type flash memory.

12. The memory system according to claim 9, wherein the temperature sensor is configured to acquire the operating temperature of the nonvolatile semiconductor memory.

13. The memory system according to claim 9, wherein the temperature sensor is configured to acquire the operating temperature of the controller.

14. A method of selecting an operation setting of a memory system that includes a nonvolatile semiconductor memory and a controller configured to control the nonvolatile semiconductor memory, among a plurality of operation settings in which electric power consumptions of the memory system vary, said method comprising:
acquiring operating temperatures of at least one of the nonvolatile semiconductor memory or the controller at predefined time intervals while the memory system is powered on;
calculating an average operating temperature of the acquired operating temperatures; and
selecting one of the plurality of operation settings based on the average operating temperature.

15. The method according to claim 14, further comprising:
controlling the nonvolatile semiconductor memory to operate according to a first operation setting during a first period in which the average temperature satisfies a predetermined operating temperature condition; and
controlling the nonvolatile semiconductor memory to operate according to a second operation setting during a second period in which the average temperature does not satisfy the operating temperature condition, wherein
an electric power consumption of the memory system in the second operation setting is smaller than the electric power consumption of the memory system in the first operation setting.

16. The method according to claim 15, further comprising:
controlling the nonvolatile semiconductor memory to operate according to the first operation setting during the first period in which the average operating temperature does not exceed a threshold temperature; and
controlling the nonvolatile semiconductor memory to operate according to the second operation setting during the second period in which the average operating temperature is equal to or higher than the threshold temperature.

17. The method according to claim 14, wherein the acquired operating temperatures are each an operating temperature of the nonvolatile semiconductor memory.

18. The method according to claim 14, wherein the acquired operating temperatures are each an operating temperature of the controller.

* * * * *